(12) United States Patent
Yates et al.

(10) Patent No.: US 12,218,255 B2
(45) Date of Patent: Feb. 4, 2025

(54) HIGH VOLTAGE GALLIUM NITRIDE VERTICAL PN DIODE

(71) Applicant: National Technology & Engineering Solutions of Sandia, LLC, Albuquerque, NM (US)

(72) Inventors: Luke Yates, Albuquerque, NM (US); Brendan P. Gunning, Albuquerque, NM (US); Mary H. Crawford, Albuquerque, NM (US); Jeffrey Steinfeldt, Rio Rancho, NM (US); Michael L. Smith, Albuquerque, NM (US); Vincent M. Abate, Albuquerque, NM (US); Jeramy R. Dickerson, Edgewood, NM (US); Andrew M. Armstrong, Los Ranchos de Albuquerque, NM (US); Andrew Binder, Albuquerque, NM (US); Andrew A. Allerman, Tijeras, NM (US); Robert J. Kaplar, Albuquerque, NM (US); Jack David Flicker, Albuquerque, NM (US); Gregory W. Pickrell, Rio Rancho, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 419 days.

(21) Appl. No.: 17/572,360

(22) Filed: Jan. 10, 2022

(65) Prior Publication Data

US 2022/0165888 A1  May 26, 2022

Related U.S. Application Data

(63) Continuation-in-part of application No. 16/589,428, filed on Oct. 1, 2019, now Pat. No. 11,227,844.

(Continued)

(51) Int. Cl.
*H01L 29/861* (2006.01)
*H01L 29/20* (2006.01)
(Continued)

(52) U.S. Cl.
CPC ...... *H01L 29/8611* (2013.01); *H01L 29/2003* (2013.01); *H01L 29/452* (2013.01); *H01L 29/66136* (2013.01)

(58) Field of Classification Search
CPC .................................................. H01L 29/0623
See application file for complete search history.

(56) References Cited

U.S. PATENT DOCUMENTS 9,666,677 B1  5/2017  Raring et al.
9,716,202 B2  6/2017  Curry et al.
(Continued)

FOREIGN PATENT DOCUMENTS

CN  106971943 A  *  7/2017  ....... H01L 29/66143
CN  109950300 A  *  6/2019
(Continued)

OTHER PUBLICATIONS

Baliga, B. J. "Gallium Nitride Devices for Power Electronic Applications," Semiconductor Science and Technology, 2013, vol. 28, 074011, 8 pages.
(Continued)

*Primary Examiner* — Peter Bradford
(74) *Attorney, Agent, or Firm* — Kevin W. Bieg (57) ABSTRACT

A vertical gallium nitride (GaN) PN diode uses epitaxial growth of a thick drift region with a very low carrier concentration and a carefully designed multi-zone junction termination extension to achieve high voltage blocking and high-power efficiency. An exemplary large area (1 mm$^2$) diode had a forward pulsed current of 3.5 A, an 8.3 mΩ-cm$^2$ specific on-resistance, and a 5.3 kV reverse breakdown. A (Continued)

smaller area diode (0.063 mm²) was capable of 6.4 kV breakdown with a specific on-resistance of 10.2 mΩ-cm², when accounting for current spreading through the drift region at a 45° angle.

10 Claims, 8 Drawing Sheets

Related U.S. Application Data (60) Provisional application No. 62/743,287, filed on Oct. 9, 2018.

(51) Int. Cl.
 H01L 29/45 (2006.01)
 H01L 29/66 (2006.01)

(56) References Cited

U.S. PATENT DOCUMENTS

| | | | |
|---|---|---|---|
| 9,887,086 | B2 | 2/2018 | Minamisawa et al. |
| 2012/0218796 | A1* | 8/2012 | Okamoto .............. H01L 29/872 257/E29.081 |
| 2012/0292636 | A1* | 11/2012 | Zhang ................... H01L 29/732 257/77 |
| 2012/0313212 | A1* | 12/2012 | Sugawara ............. H01L 29/872 257/653 |
| 2013/0020611 | A1* | 1/2013 | Gumaelius .......... H01L 21/3065 438/694 |
| 2013/0020635 | A1* | 1/2013 | Yilmaz ............... H01L 29/0619 257/334 |
| 2016/0372609 | A1 | 12/2016 | Kiyama et al. |
| 2017/0271158 | A1 | 9/2017 | Minamisawa et al. |
| 2022/0157951 | A1* | 5/2022 | Yilmaz ............... H01L 29/8611 |

FOREIGN PATENT DOCUMENTS

| | | | | | |
|---|---|---|---|---|---|
| CN | 112216694 | A | * | 1/2021 | ......... H01L 21/8213 |
| CN | 113658860 | A | * | 11/2021 | .......... H01L 29/0611 |

OTHER PUBLICATIONS

Carlson, E. P. et al., "Power Electronic Devices and Systems Based on Bulk GaN Substrates," Materials Science Forum, 2018, vol. 924, pp. 799-804.
Armstrong, A. M. et al., "High Voltage and High Current Density Vertical GaN Power Diodes," Electronics Letters, 2016, vol. 52, pp. 1170-1171.
Motoki, K., "Development of Gallium Nitride Substrates," SEI Technical Review, 2010, No. 70, pp. 28-35.
Ohta, H. et al., "5.0 kV Breakdown-Voltage Vertical GaN p-n Junction Diodes," Japanese Journal of Applied Physics, 2018, vol. 57, pp. 04FG09-1-04FG09-.4.
Kizilyalli, I. et al., "Vertical Power p-n Diodes Based on Bulk GaN," IEEE Transactions on Electron Devices, 2015, vol. 62, pp. 414-422.
Pu, T. et al., "Review of Recent Progress on Vertical GaN-Based PN Diodes," Nanoscale Research Letters, 2021, vol. 16, 14 pages.
King, M. P. et al., "Identification of the Primary Compensating Defect Level Responsible for Determining Blocking Voltage of Vertical GaN Power Diodes," Applied Physics Letters, 2016, vol. 109, pp. 183503-1-183503-5.
Dickerson, J. R. et al., "Simulation and Design of Step-Etched Junction Termination Extensions for GaN Power Diodes," 2020 4th IEEE Electron Devices Technology & Manufacturing Conference (Proceedings of Technical Papers (EDTM), 2020, 4 pages.
Cao, X. A. et al., "Electrical Effects of Plasma Damage in p-GaN," Applied Physics Letters, 1999, vol. 75, pp. 2569-2571.

* cited by examiner

HIGH VOLTAGE GALLIUM NITRIDE VERTICAL PN DIODE

CROSS-REFERENCE TO RELATED APPLICATIONS

This application is a continuation-in-part of U.S. application Ser. No. 16/589,428, filed Oct. 1, 2019, which claims the benefit of U.S. Provisional Application No. 62/743,287, filed Oct. 9, 2018, both of which are incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to high power electronic devices and, in particular, to a high-voltage vertical gallium nitride PN diode.

BACKGROUND OF THE INVENTION

Gallium nitride (GaN) is a wide-bandgap semiconductor that has advantageous material properties allowing for high breakdown electric field, enhanced mobility, and a high saturation velocity. See S. Adachi, *Physical Properties of III-V Semiconductor Compounds*, John Wiley & Sons (1992); and R. Quay, Gallium Nitride Electronics, Springer Science & Business Media, (2008). From a power device perspective, these properties enable the development of electronic devices with lower on-resistance, higher breakdown, and a substantial reduction in power conversion loss during high frequency operation as compared to Si and SiC. See B. J. Baliga, *Semicond. Sci. Technol.* 28(7), 074011 (2013); and E. P. Carlson et al., *Mater. Sci. Forum* 924, 799 (2018). Recent commercial advancements in GaN substrate availability and quality have helped to facilitate research efforts aimed at the development of high-power vertical PN diodes with exceptional blocking voltage. See A. Armstrong et al., *Electron. Lett.* 52(13), 1170 (2016); K. Motoki, *SEI Tech. Rev.* 70, 28 (2010); H. Ohta et al., *Jpn. J. Appl. Phys.* 57(4S), 04FG09 (2018); I. C. Kizilyalli et al., *IEEE Trans. Electron Devices* 62(2), 414 (2014); and T. Pu et al., *Nanoscale Res. Lett.* 16(1), 1 (2021). This development is essential because vertical geometries are well-suited for power applications due to their potential for high current density and their ability to hold off large voltages in a reduced die area as compared to lateral devices. See S. Chowdhury, "Vertical gallium nitride technology," in Power GaN Devices, Springer, 2017, pp. 101-121. Currently, GaN vertical devices are being investigated for numerous power conversion applications requiring a medium to high voltage capability (1-35 kV). See X. Zhu et al., "Grid Value Investigation of Medium-Voltage Back-to-Back Converters," in 2021 *IEEE Power & Energy Society Innovative Smart Grid Technologies Conference (ISGT)*, 2021: IEEE, pp. 1-5. These include electric and hybrid electric vehicles, solid-state transformers, renewable energy conversion, and many other applications. See M. Kanechika et al., "Advanced SiC and GaN power electronics for automotive systems," in 2010 *International Electron Devices Meeting*, 2010: IEEE, pp. 13.5. 1-13.5. 4; T. Kachi, "GaN devices for automotive application and their challenges in adoption," in 2018 *IEEE International Electron Devices Meeting (IEDM)*, 2018: IEEE, pp. 19.5. 1-19.5. 4; L. Yates et al., "Electro-thermal Simulation and Performance Comparison of 1.2 kV 10 A Vertical GaN MOSFETs," Sandia National Lab. (SNL-NM), Albuquerque, NM (United States), 2020; G. Longobardi et al., "GaN power devices for Electric Vehicles State-of-the-art and future perspective," in 2018 *IEEE International Conference on Electrical Systems for Aircraft, Railway, Ship Propulsion and Road Vehicles & International Transportation Electrification Conference (ESARS-ITEC)*, 2018: IEEE, pp. 1-6; H. Beiranvand et al., "Comparative study of heatsink volume and weight optimization in SST DAB cells employing GaN, SiC-MOSFET and Si-IGBT switches," in 2019 10th *International Power Electronics, Drive Systems and Technologies Conference (PEDSTC)*, 2019: IEEE, pp. 297-302; A. Castellazzi et al., *Energies* 12(23), 4462 (2019); A. Q. Huang, "Power semiconductor devices for smart grid and renewable energy systems," *Power Electronics in Renewable Energy Systems and Smart Grid: Technology and Applications*, pp. 85-152, 2019; I. C. Kizilyalli et al., "Current and future directions in power electronic devices and circuits based on wide band-gap semiconductors," in 2017 *IEEE 5th Workshop on Wide Bandgap Power Devices and Applications (WiPDA)*, 2017: IEEE, pp. 417-417; and H. Amano et al., *J. Phys. D: Appl. Phys.* 51(16), 163001 (2018). In addition, vertical GaN PN diodes have been proposed as a electro-magnetic pulse arrestor device that could protect against extremely fast transient events (<1 µs) with a response time on the order of ~10 ns. See R. J. Kaplar et al., "Development of High-Voltage Vertical GaN PN Diodes," in 2020 *IEEE International Electron Devices Meeting (IEDM)*, 2020: IEEE, pp. 5.1. 1-5.1. 4; and U.S. application Ser. No. 16/589,428.

However, there are two primary challenges in the development of high voltage vertical GaN PN diodes. The first challenge is the ability to grow sufficiently thick epitaxial layers with low net carrier concentration. The ability to control low carrier concentration becomes increasingly difficult when the background carbon concentration incorporated during the growth is comparable to the intentionally incorporated donor dopant (typically Si). Carbon acts as a deep acceptor and compensates the Si donor atoms. See M. King et al., *Appl. Phys. Lett.*, 109(18), 183503 (2016); and T. Tanaka et al., *Jpn. J. Appl. Phys.* 55(6), 061101 (2016). Practically, this requires growth conditions and flow rates that allow for the difference of two very large numbers with similar magnitudes to result in a net carrier concentration ($N_d-N_a$) on the order of $1\times10^{15}$ cm$^{-3}$ or less. See M. King et al., *Appl. Phys. Lett.*, 109(18), 183503 (2016). The second challenge is the proper electric field management at the periphery of the device during large voltage blocking scenarios. Often PN diodes will see a significant reduction in breakdown voltage, compared to the theoretical value, due to electric field crowding. If no mitigation is incorporated into the device structure, the electric field will concentrate at the PN junction or anode edge resulting in premature and often catastrophic breakdown. See T. Pu et al., *Nanoscale Res. Lett.* 16(1), 1 (2021). Multiple methods have been implemented to relax the field crowding effect. These include field plates, counter doping, nitrogen implantation, guard rings, step-etching, and other forms of junction termination extension (JTE), with all but the field plate method being aimed at controlling the dose (total charge) in p-type regions that are some distance from the anode contact. See Y. Hatakeyama et al., *Jpn. J. Appl. Phys.* 52(2R), 028007 (2013); J. R. Dickerson et al., *IEEE Trans. Electron Devices*

63(1), 419 (2015); M. Cho et al., *ECS Trans.* 98(6), 49 (2020); J. R. Dickerson et al., "Simulation and Design of Step-Etched Junction Termination Extensions for GaN Power Diodes," in 2020 *4th IEEE Electron Devices Technology & Manufacturing Conference (EDTM)*, 2020: IEEE, pp. 1-4; A. T. Binder et al., "Bevel edge termination for vertical GaN power diodes," in 2019 *IEEE 7th Workshop on Wide Bandgap Power Devices and Applications (WiPDA)*, 2019: IEEE, pp. 281-285; and J. J. Wierer et al., *IEEE Trans. Electron Devices* 64(5), 2291 (2017). The design of an efficient JTE requires knowledge of the critical electric field for a given carrier concentration, which is directly dependent on knowledge of the impact ionization parameters of a material, a subject that is still under investigation in GaN. See D. Ji and S. Chowdhury, *Appl. Phys. Lett.* 117(25), 252107 (2020); D. Ji et al., *Appl. Phys. Lett.* 115(7), 073503 (2019); and T. Maeda et al., *J. Appl. Phys.* 129(18), 185702 (2021). Recent reports have demonstrated vertical GaN PN diodes capable of 5 kV blocking voltages using both field plate and guard ring mitigation strategies along with a three-part drift region with a net carrier concentration less than $10^{16}$ cm$^{-3}$ and a small anode contact area. See H. Ohta et al., *Jpn. J. Appl. Phys.* 57(4S), 04FG09 (2018). However, a need remains for a large contact area, vertical GaN PN diode with a thick, low-doped drift region that provides good avalanche breakdown at high voltage.

SUMMARY OF THE INVENTION

The present invention is directed to a high voltage gallium nitride vertical PN diode, comprising a high-doped n-type gallium nitride substrate or contact layer; a low-doped n-type gallium nitride drift layer epitaxially grown on the gallium nitride substrate, wherein the drift layer is greater than 10 microns in thickness and has a donor concentration of less than $2\times10^{15}$/cm$^3$; a p-type region epitaxially grown on the drift layer, thereby forming a PN junction with the drift layer; an ohmic cathode contact to the high-doped n-type gallium nitride substrate or contact layer; an ohmic anode contact to the p-type region layer; and a step-etched multi-zone junction termination structure laterally surrounding the anode contact in the p-type region layer. The low-doped n-type gallium nitride drift layer can be grown by metal-organic chemical vapor deposition under compensation doping conditions. The area of the anode contract can be greater than 0.01 mm$^2$ and, preferably, greater than 0.1 mm$^2$.

As examples of the invention, large area (up to 1 mm$^2$) vertical GaN PN diodes were fabricated on bulk GaN substrates that were capable of 6 kV blocking voltage. This high blocking voltage was achieved via MOCVD epitaxial growth of a 50 μm drift region with a very low carrier concentration of $<1\times10^{15}$ cm$^{-3}$, and a carefully designed 4-zone step-etched JTE. A large area diode with a forward pulsed current of 3.5 A, an 8.3 mΩ-cm$^2$ specific on-resistance, and a 5.3 kV reverse breakdown was demonstrated. A small area diode had a non-destructive breakdown of 6.4 kV with a specific on-resistance of 10.2 mΩ-cm$^2$ when accounting for current spreading through the drift region at a 45° angle. A positive temperature coefficient of breakdown was demonstrated, confirming an avalanche process for the devices.

BRIEF DESCRIPTION OF THE DRAWINGS

The detailed description will refer to the following drawings, wherein like elements are referred to by like numbers.

DETAILED DESCRIPTION OF THE INVENTION

Figure 1:
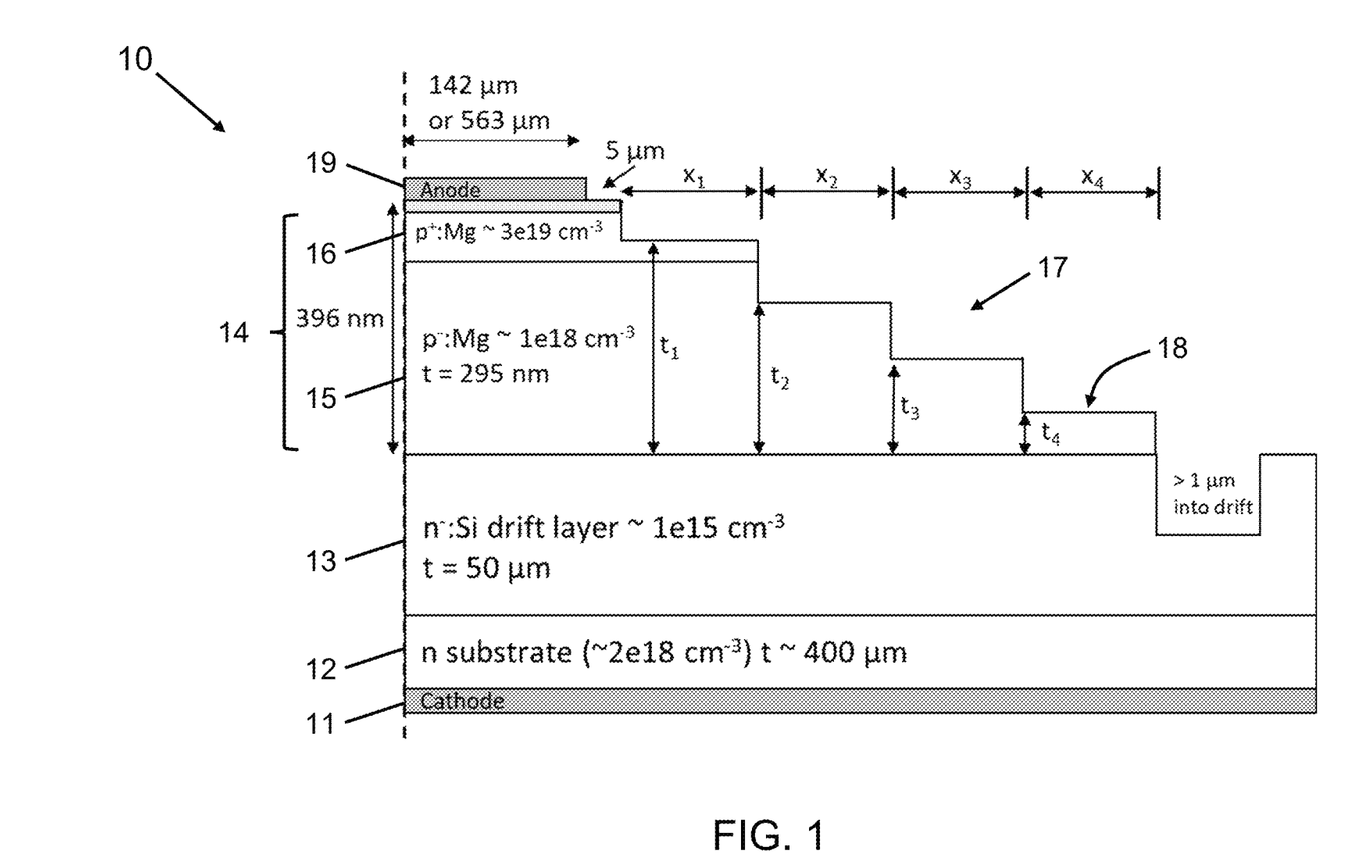
FIG. 1 is an axisymmetric schematic illustration of an exemplary vertical PN diode with a 4-zone step-etched JTE (not to scale). The JTEs were designed to ensure full depletion of the smallest zone and a uniform electric field at breakdown in the remaining zones. Anode diameters of 284 mm and 1.126 mm were fabricated.

A schematic cross-sectional illustration an exemplary high voltage GaN PN diode 10 is shown in FIG. 1. The diode 10 comprises a greater than 10-μm thick low-doped n-type GaN voltage-blocking drift layer 13 epitaxially grown on a highly doped (e.g., a few orders of magnitude higher than the drift layer doping) n-GaN substrate 12 or contact layer. The n-type GaN drift layer 13 can be doped with a donor (e.g., Si) and have an electron concentration of less than about $2\times10^{15}$ cm$^{-3}$. Next, a p-type region 14 comprising a moderately doped p-GaN layer 15 capped with a heavily doped p$^-$-GaN layer 16 is grown to assist in forming a good p-type contact. The p-GaN/n$^-$-GaN layers form the main junction of the vertical PN diode. Next, a JTE structure 17 comprising a series of stepped zones 18 is formed in the p-region layers 14 outside of the main PN junction. Finally, ohmic metal contacts are deposited on the top of the high-doped p$^+$-GaN layer, to form the anode contact 19, and the exposed bottom side of the n-GaN substrate, to form the cathode contact 11.

During forward-bias operation, charge carriers are injected from the highly doped p- and n-layers (i.e., anode and cathode). Conversely, under increased reverse bias, the depletion region and electric field increase inside the diode.

Because of the low doping in the drift layer, most of the potential will drop across the drift layer in the region of the main PN junction. The variation in thickness in the JTE structure reduces field crowding at the PN junction periphery, thereby reducing the peak electric field to avoid premature avalanche breakdown under reverse bias. Avalanche breakdown will occur at a critical electric field due to runaway impact ionization from highly energetic electrons and holes.

As an example of the invention, PN diodes with large anode areas were fabricated. The exemplary diodes experienced non-catastrophic breakdown and demonstrated a temperature-dependent breakdown voltage consistent with an avalanche breakdown process. This was achieved with a thick, low-doped n⁻ drift region and step-etched multi-zone JTE (MZ-JTE) design which consisted of either 2 or 4 zones. Both JTE designs resulted in device breakdowns up to or greater than 6 kV. Additionally, several fabricated devices were found to have exceptional leakage current suppression with a reverse leakage current density less than $1 \times 10^{-6}$ A/cm² up to 90% of breakdown.

Device Fabrication

Epitaxial growth was performed via metal organic chemical vapor deposition (MOCVD) in a Taiyo Nippon Sanso Corp (TNSC) SR4000HT reactor. The substrate was a commercially available HVPE-grown laser diode grade 2" GaN substrate with nominal thickness of 400 μm, threading dislocation density of ~10⁶ cm⁻², and electron concentration of ~2×10¹⁸ cm⁻³. As shown in FIG. 1, the complete epi structure of the exemplary device consisted of a 15 nm p⁺⁺ GaN contact layer (Mg~2×10²⁰ cm⁻³), 86 nm p⁺ GaN (Mg~3×10¹⁹ cm⁻³), 295 nm p⁻ GaN (Mg~1×10¹⁸ cm⁻³), and a 50 μm thick lightly-doped n⁻ GaN:Si drift layer. Trimethylgallium and ammonia were used as precursors in a mixed $H_2/N_2$ carrier gas, while silane ($SiH_4$) and bis(cyclopentadienyl)magnesium ($MgCp_2$) were used as n- and p-type dopants, respectively. The growth was performed at atmospheric pressure (~630 torr) at a substrate temperature of 1050° C. for the drift layer, 1015° C. for the p-type anode layers, and 920° C. for the p⁺⁺ contact layer. Activation of the Mg acceptors was achieved by thermal annealing at 900° C. for 15 minutes in nitrogen. The sheet resistance of the p-type anode was estimated as 68 kΩ/sq from on-wafer CTLM measurements. A Nomarski microscope map of the 50 μm thick epilayer after growth indicated sporadic deposition of large particles, but the density of particles had a minimal impact on device yield. Further characterization by atomic force microscopy confirmed an atomically smooth, step-bunch-free surface morphology with roughness <0.3 nm RMS.

As described above, one of the key challenges in realizing breakdown voltages >5 kV in vertical GaN devices is the need for doping control at carrier concentrations ≤10¹⁵ cm⁻³. This is quite difficult due to compensating carbon impurities that are present in the reactor from the decomposition of metalorganic precursors. Thus, to achieve very low doping levels one must have an accurate measurement of the carbon concentration in the drift layer (~6×10¹⁵ cm⁻³ in this exemplary device as measured by secondary-ion mass spectroscopy for a separate growth), as well as precise control of Si doping. The dopant flow used here produced a net electron concentration of ~0.5-1×10¹⁵ cm⁻³ with some variation across the wafer.

After the epitaxial growth, the 2" wafer was divided into 4 quarters and each quarter was processed individually. One quarter was used to process devices with a 2-zone JTE and another was processed using a 4-zone JTE design. The charge required to terminate electric field lines into the JTE and ensure a uniform field profile that is distributed across multiple steps away from the anode contact was calculated based on Gauss's Law. See J. R. Dickerson et al., "Simulation and Design of Step-Etched Junction Termination Extensions for GaN Power Diodes," in 2020 *4th IEEE Electron Devices Technology & Manufacturing Conference (EDTM)*, 2020: IEEE, pp. 1-4, which is incorporated herein by reference. The thicknesses for each JTE design are shown in Table I. The anticipated critical electric field values at $N_d-N_a=1\times10^{15}$ cm⁻³ carrier concentration are 2.34 MV/cm and 1.84 MV/cm, based on ionization coefficients from both Ji and Maeda, respectively. See D. Ji et al., *Appl. Phys. Lett.* 115(7), 073503 (2019); and T. Maeda et al., *J. Appl. Phys.* 129(18), 185702 (2021). While other groups have reported ionization coefficients for GaN, Ji and Maeda encompass the best known upper and lower bounds in the current literature. See L. Cao et al., *IEEE Trans. Electron Devices* 68(3), 1228 (2021); K. Kunihiro et al., *IEEE Electron Device Lett.* 20(12), 608 (1999); and A. M. Ozbek, "Measurement of Impact Ionization Coefficients in Gallium Nitride," North Carolina State University, 2011. The maximum electric field at breakdown is expected to span over multiple zones for the 4-zone design. For the 2-zone design, the 1ˢᵗ zone will come close to fully depleting for either critical field extreme and the 2ⁿᵈ zone would have a uniform electric field during breakdown. The goal of both JTE designs was to increase the process window for an estimated critical electrical field, to account for variations from targeted values of doping and step height, and to account for potential etch damage impacts on the top surfaces. See X. Cao et al., *Appl. Phys. Lett.* 75(17), 2569 (1999). An axisymmetric schematic illustration of the exemplary 4-zone JTE design and epilayer stack is shown in FIG. 1. The 2-zone JTE design maintains the total JTE width, with the thickness and width of each zone increased relative to those of the 4-zone JTE design. While not depicted in FIG. 1, $t_1'$, $t_2'$, $x_1'$, and $x_2'$ from Table 1 are the relative JTE thicknesses and step widths for the 2-zone JTE design. In addition, the mask layout consisted of four step width variations for each design. These are denoted in Table 1 as Var 1, 2, 3, and 4, resulting in total JTE widths of 150, 200, 250, and 300 μm for both designs.

TABLE 1

Thicknesses for junction termination extension designs

| 4-zone (nm) | | | | 2-zone (nm) | |
|---|---|---|---|---|---|
| $t_1$ | $t_2$ | $t_3$ | $t_4$ | $t_1'$ | $t_2'$ |
| 325 | 251 | 172 | 90 | 260 | 137 |
| step width (μm) | | | | step width (μm) | |
| $x_1 = x_2 = x_3 = x_4$ | | | | $x_1' = x_2'$ | |
| Var 1 | | | 37.5 | Var 1 | 75 |
| Var 2 | | | 50 | Var 2 | 100 |
| Var 3 | | | 62.5 | Var 3 | 125 |
| Var 4 | | | 75 | Var 4 | 150 |

The JTE design was implemented using standard GaN processing methods. The p-GaN ohmic contact for the anode electrode was formed via e-beam evaporation of 20 nm of Pd and 320 nm of Au, followed by a rapid thermal anneal at 600° C. for 1 min in $N_2$ ambient. The specific contact resistance of the p-GaN ohmic contact was estimated to be $5.7\times10^{-5}$ Ω-cm² from CTLM measurements. This is in line with previously reported results from Cho, in which they measured a specific contact resistance of $2.4\times10^{-5}$ Ω-cm² for a Pd/Ni/Au contact on a p-GaN layer with $2\times10^{17}$ cm⁻³ carrier concentration. See H. Cho et al., Solid State Electon.

Figure 2A:
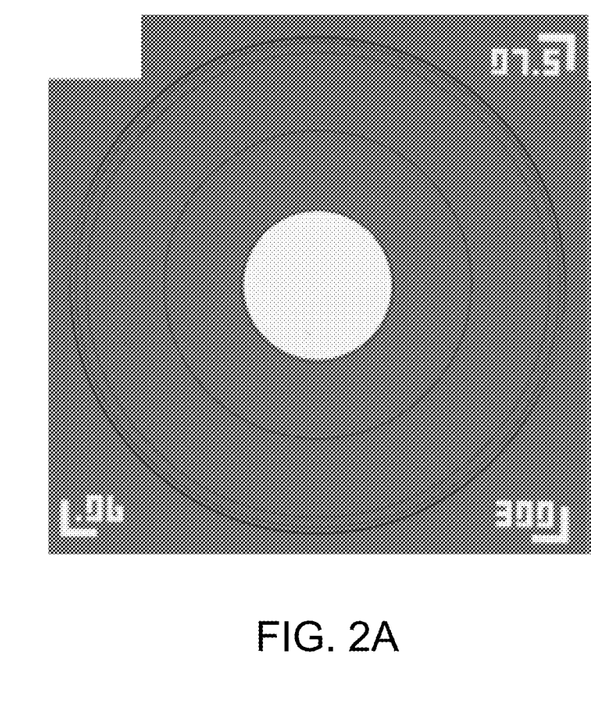
FIG. 2A is an image of a completed vertical GaN PN diodes with a 2-zone JTE design.
Figure 2B:
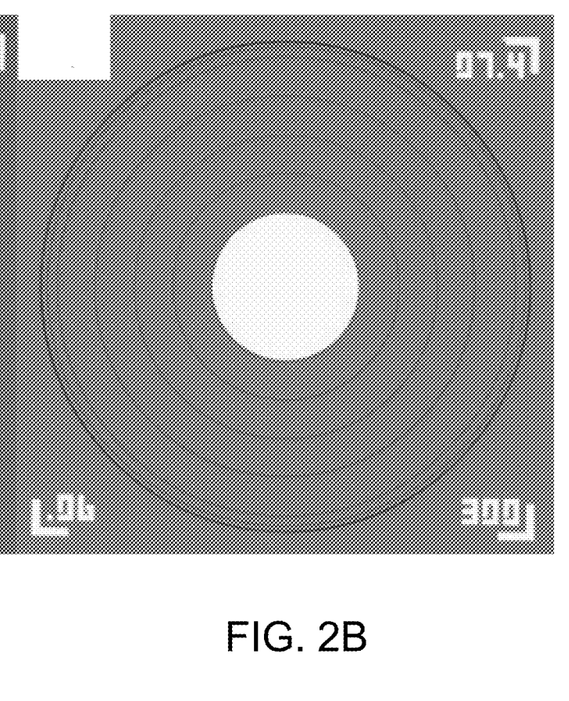
FIG. 2B is an image of a completed vertical GaN PN diodes with a 4-zone JTE design.

49(5), 774 (2005). The isolation trench and step-etching were carried out with a $BCl_3/Cl_2$-based inductively coupled plasma reactive ion etching (ICP-RIE) with an ICP and RF power of 125 W and 10 W, respectively. Finally, a non-alloyed Ti/Al/Ti/Ni/Au (10 nm/200 nm/30 nm/50 nm/300 nm) was evaporated on the back side of the GaN substrate to form the cathode contact. Completed devices with both the 2-zone and 4-zone JTE are shown in FIGS. 2A and 2B. It should be noted that the exemplary PN diodes did not contain device passivation due to prior evidence of passivation damage induced leakage. See L. Chen et al., *IEEE Trans. Device Mater. Reliab.* 18(3), 359 (2018); and S. Kolli et al., *J. Mater. Sci.: Mater. Electron.* 29(22), 19353 (2018).

Experimental Results

Devices were evaluated using a Keysight B1505A Power Device Analyzer/Curve Tracer with the N1268A ultra high voltage expander. This allows for reverse I-V characteristics up to 10 kV with a ~100 pA noise floor. The fabricated PN diodes were immersed in Fluorinert (FC-70) during testing to avoid premature breakdown in air or at the device surface. Measurements were performed under dc bias unless otherwise indicated. Additional forward I-V and capacitance-voltage (C-V) measurements were performed to fully characterize the devices and epilayers. Finally, temperature dependent reverse breakdown measurements were done to demonstrate a robust avalanche capability.

Figure 3:
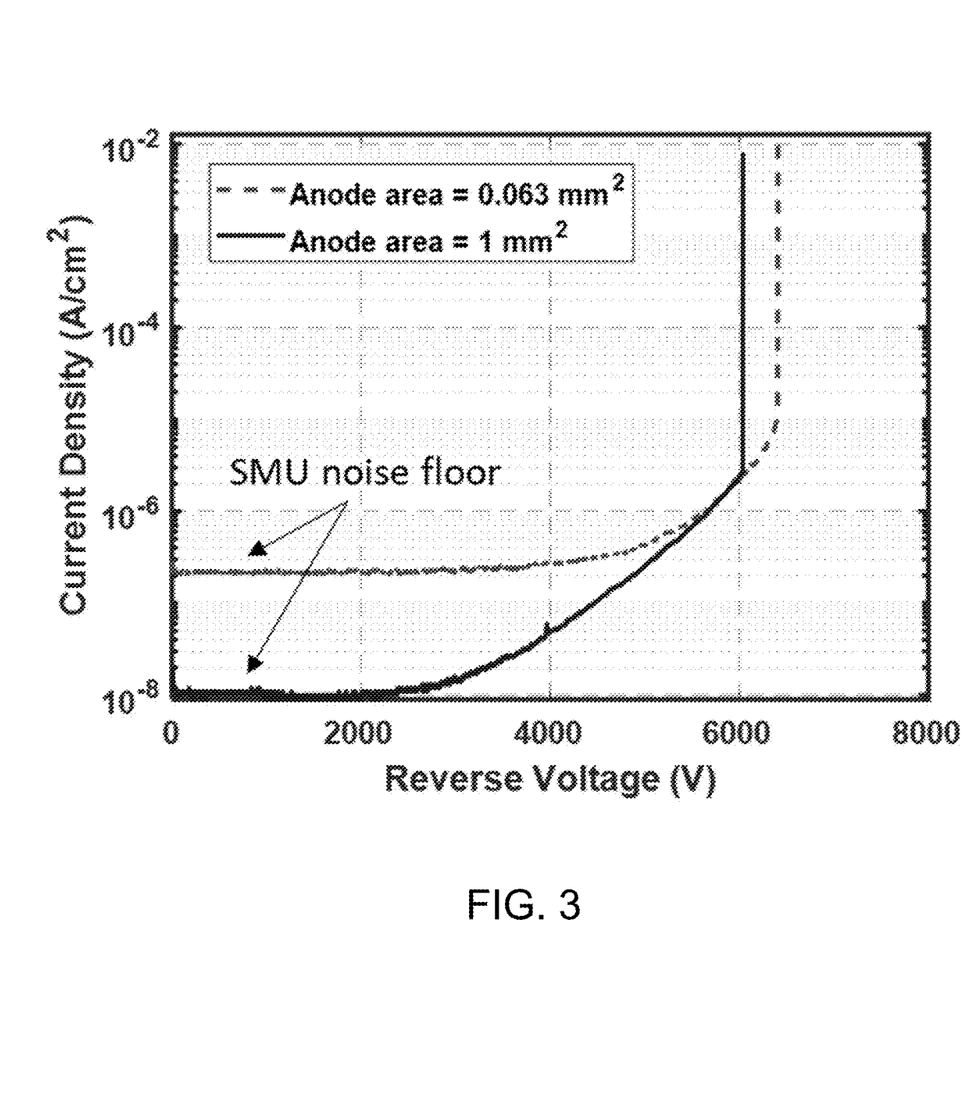
FIG. 3 is a graph of reverse I-V characteristics and breakdown voltage of two PN diodes with an anode area of 0.063 mm$^2$ and 1 mm$^2$. The noise floor change is a result of different anode areas and not due to the characterization equipment.

FIG. 3 shows the reverse voltage characteristics and breakdown for two of the best performing devices, a 0.063 mm$^2$ device and a 1 mm$^2$ device. Both devices consisted of a 4-zone JTE design with a total JTE width of 300 µm. The 1 mm$^2$ diode had a breakdown voltage of 6.0 kV with a leakage current of $<1\times10^{-6}$ A/cm$^2$ up to 5.4 kV (i.e., 90% of its demonstrated breakdown). The 0.063 mm$^2$ diode was able to achieve a breakdown voltage of 6.4 kV, again with $<1\times10^{-6}$ A/cm$^2$ leakage current up to 5.6 kV, i.e., 88% of its breakdown. Note that the noise floor in FIG. 3 changes because of differing anode areas and is not due to any change in characterization equipment. In the implemented test configuration, the minimum current was limited to ~100 pA. Breakdown voltages of greater than 6.0 kV were obtained from 4-zone JTEs with total widths ranging from 200 µm to 300 µm. The devices with the lowest leakage and largest breakdown came from the 4-zone JTE design with a 300 µm total width. Ohta demonstrated a vertical GaN PN diode capable of 5.0 kV breakdown that consisted of a three-layer growth stack in which the carrier concentration was graded throughout the drift region and utilized a low doped ($<2\times10^{15}$ cm$^{-3}$) layer at the junction. See H. Ohta et al., *Jpn. J. Appl. Phys.* 57(4S), 04FG09 (2018). This was postulated to suppress the maximum electric field at the junction and aid in reducing the on-resistance of the device. The device structures reported by Ohta consisted of diodes with a 60 µm anode diameter. The uniform low doped ($<1\times10^{15}$ cm$^{-3}$) 50 µm thick drift region of the exemplary device of the present invention is capable of achieving a 6.0 kV breakdown for a device with a 1 mm$^2$ anode area contact.

Figure 4A:
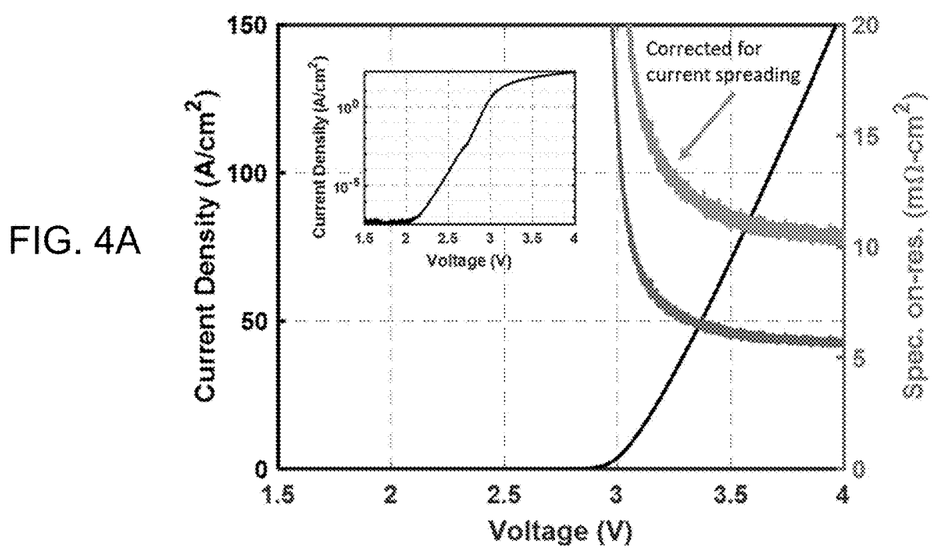
FIG. 4A is a graph of forward I-V characteristics of the 6.4 kV diode with an anode area of 0.063 mm$^2$.
Figure 4B:
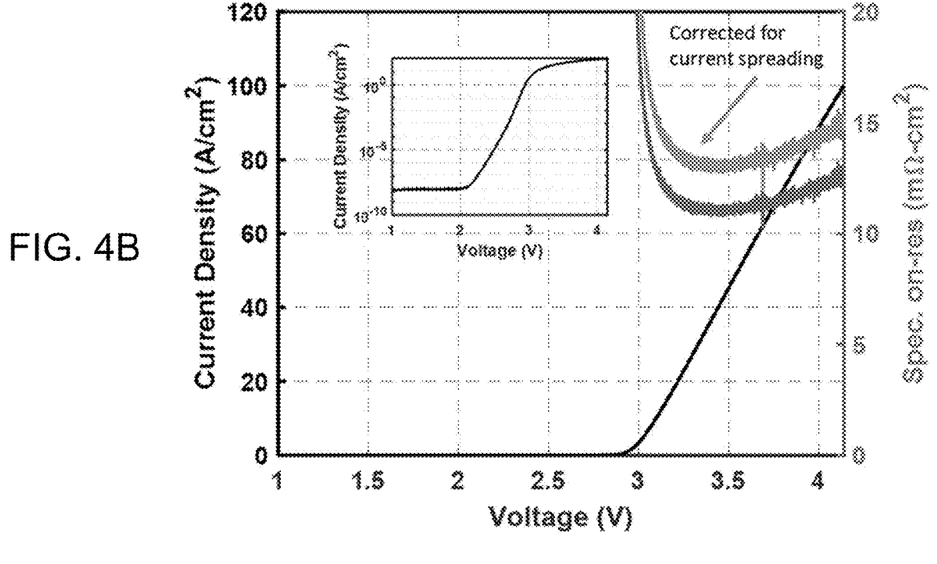
FIG. 4B is a graph of forward I-V characteristics of the 6.0 kV diode with an anode area of 1 mm$^2$. Insets show forward current on a semi-logarithmic scale. Right y-axis shows the device specific on-resistance calculated using both the anode area and assuming a 45° current spreading through the drift region.

The forward I-V characteristics of the two PN diodes from FIG. 3 are shown in FIGS. 4A and 4B. Both devices had a turn-on voltage of ~3.1 V based on linear extrapolation. For the 6.4 kV diode, the specific on-resistance was calculated as 5.7 mΩ-cm$^2$ when assuming an anode area of 0.063 mm$^2$; however, assuming 45° current spreading through the thickness of the drift layer, an adjusted specific on-resistance of 10.2 mΩ-cm$^2$ was calculated. Multiple models for current spreading through the drift region have been suggested, and by assuming a 45° spreading angle from the anode through the thickness of the drift region, the specific on-resistance upper limit can be bounded. See B. J. Baliga, *Fundamentals of Power Semiconductor Devices*, Springer Science & Business Media, 2010. This has substantial impact for the 0.063 mm$^2$ devices with a 50 µm drift layer, where the value almost doubles when current spreading is considered. The impact is less for the larger 1 mm$^2$ device since the additional area through the 50 µm drift region is much less compared to the anode contact itself. For this device, a specific on-resistance of 11.1 mΩ-cm$^2$ and 13.1 mΩ-cm$^2$ was calculated using the anode and spreading areas, respectively. The calculated on-resistance was taken at the low point of the curve since there appeared to be some device heating during the dc measurement that caused an increase in resistance at higher current densities. The specific on-resistances are higher than what has been previously reported for vertical GaN PN diodes with 3.7 kV and 5.0 kV breakdown. See I. C. Kizilyalli et al, *IEEE Electron Device Lett.* 35(2), 247 (2013); and H. Ohta et al., *Jpn. J. Appl. Phys.* 57(4S), 04FG09 (2018).

Figure 5A:
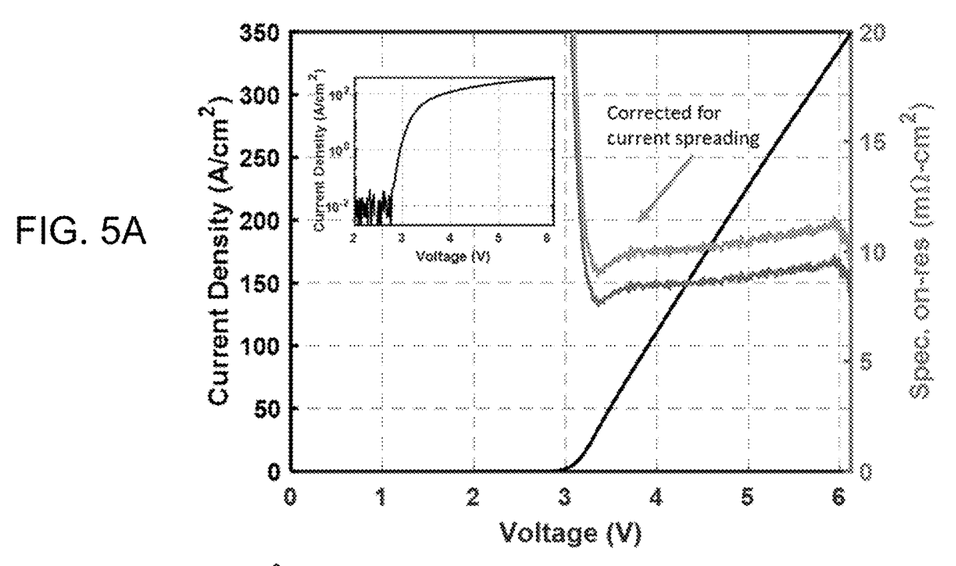
FIG. 5A is a graph of forward I-V characteristics of a 1 mm$^2$ device under pulsed conditions. Inset shows forward current on a semi-logarithmic scale.
Figure 5B:
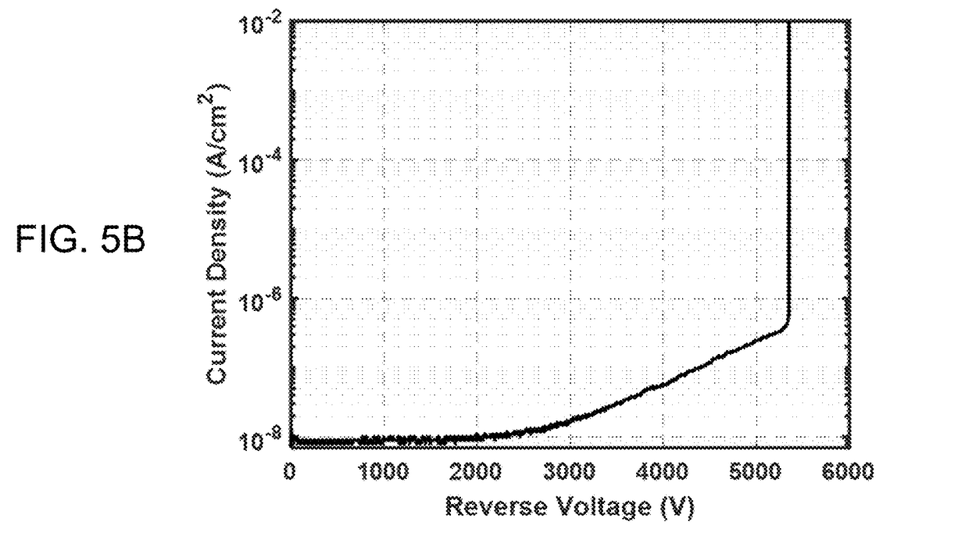
FIG. 5B is a graph of reverse I-V characteristics of the same 1 mm$^2$ device.

Additional forward I-V measurements were carried using a pulsed measurement mode to mitigate heating effects and push the devices to higher currents. The pulsed conditions consisted of a 500 µs pulse width and a 0.5% duty cycle. Under these conditions, several of the 1 mm$^2$ devices were evaluated up to 3.5 A (350 A/cm$^2$). It was found that there still appeared to be some device heating with the 500 µs pulse width, although not as severe as with the dc measurements. FIG. 5A shows the forward I-V characteristics of a 1 mm$^2$ device under the pulsed conditions. A reduction in the specific on-resistance is observed as compared to the dc measurement condition. The specific on-resistance was estimated as 8.3 mΩ-cm$^2$ and 9.7 mΩ-cm$^2$ for the anode and spreading areas, respectively. The reverse I-V characteristic for the same device is shown in FIG. 5B. A breakdown of 5.3 kV is measured with a reverse leakage current below $1\times10^{-6}$ A/cm$^2$ up to breakdown.

Figure 6:
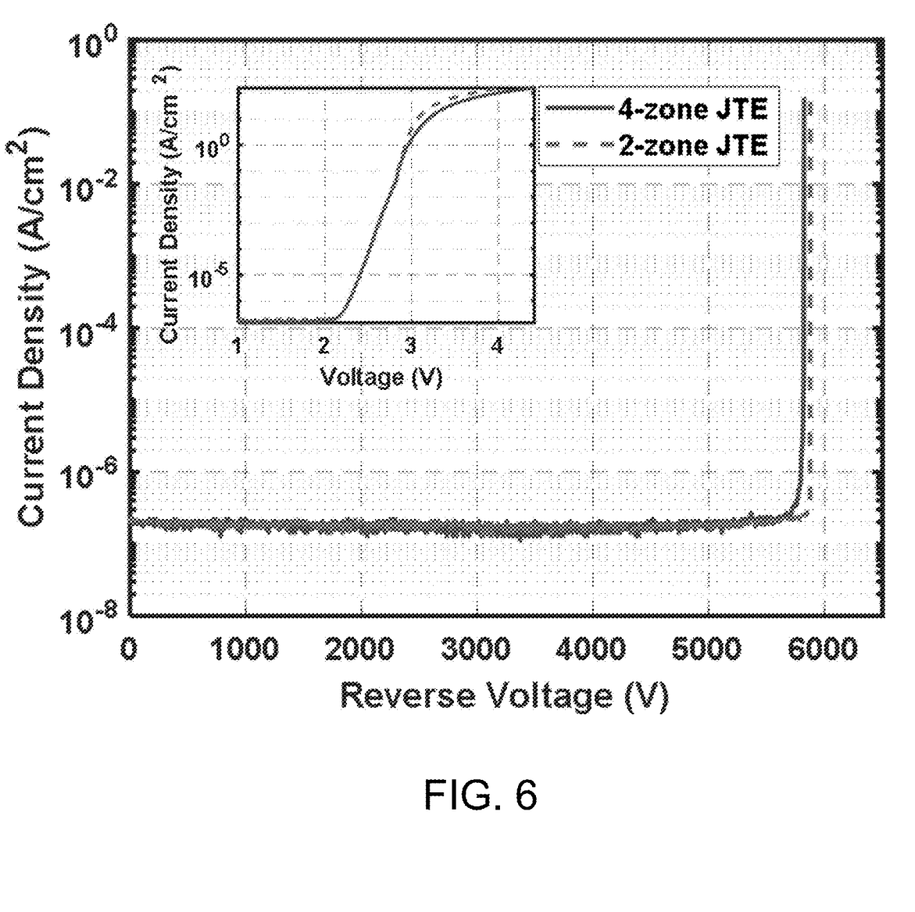
FIG. 6 is a graph of reverse I-V characteristics for 4-zone and 2-zone JTE designs where both had a total JTE width of 300 mm. A similar breakdown of ~5.9 kV is achieved with both device types. Inset shows the forward I-V characteristics on a semi-logarithmic scale.

The 4-zone JTE is expected to be more robust with higher breakdown. However, near 6 kV performance was achieved with both the 2-zone and 4-zone JTE designs, as shown in FIG. 6. From multiple device measurements it appeared that discrepancies in the reverse leakage and breakdown characteristics between devices were more likely due to processing variations and/or positional dependency of the carrier concentration across the wafer.

Figure 7A:
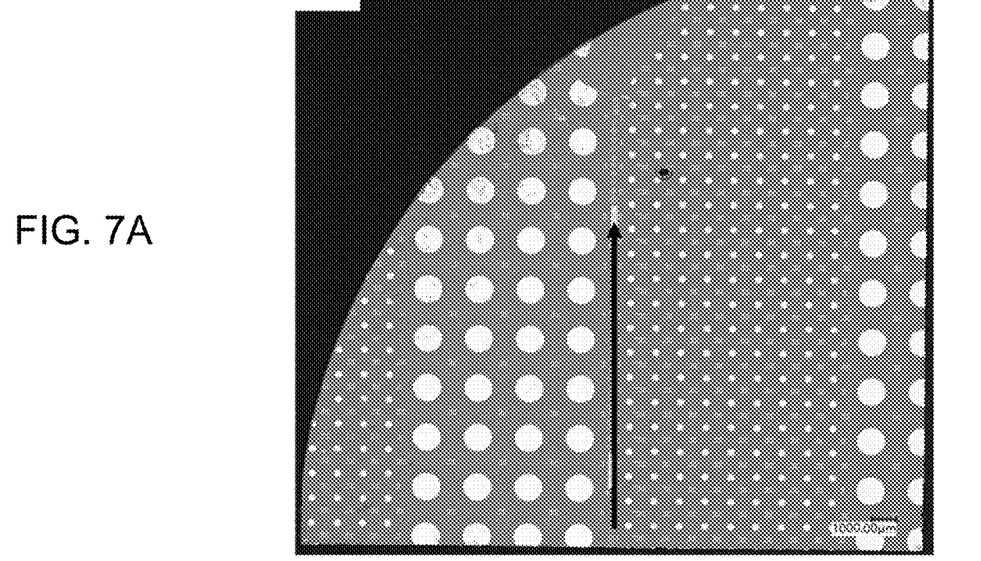
FIG. 7A is an optical microscope image of a processed quarter wafer indicating the location of device CV measurements.
Figure 7B:
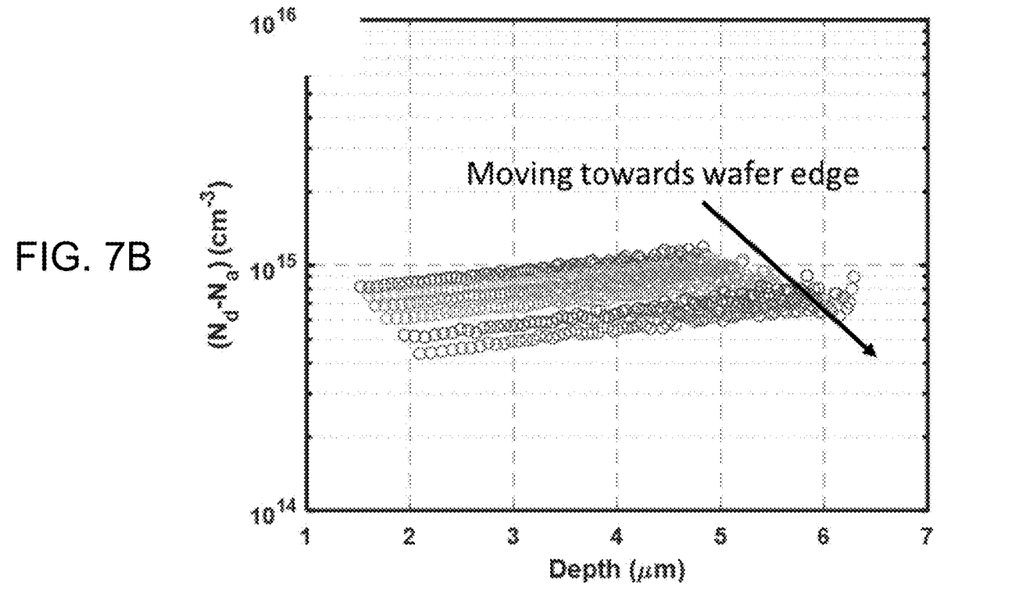
FIG. 7B is a graph showing extracted carrier concentration of measured devices in the n-GaN drift layer. A frequency of 1 MHz was used for the CV measurements.

To investigate the positional dependency on carrier concentration, small PN diodes with only an isolation etch were included on the mask set. C-V measurements were performed with these devices, considering that the area of the depletion region is readily known with this device structure. The location of measured devices on the quarter is indicated in FIG. 7A with the measured $N_d-N_a$ carrier concentration shown in FIG. 7B. The C-V device measurements indicated that the $N_d-N_a$ carrier concentration was $1\times10^{15}$ cm$^{-3}$ near the center of the wafer and dropped to around $5-6\times10^{14}$ cm$^{-3}$ towards the wafer's edge. Because the breakdown voltage is inversely proportional to the net carrier concentration, it is critical to reduce this value to obtain such high breakdown performance. However, this does increase the drift region resistance. This trade-off has been well documented and studied elsewhere. See B. J. Baliga, *J. Appl. Phys.* 53(3), 1759 (1982). In the case of the exemplary PN diodes, breakdown is limited due to the thickness of the drift region, a condition known as punch-through, where the drift region is fully depleted and the maximum electric field becomes equal to the critical electric field. See B. J. Baliga, *Funda-* mentals of Power Semiconductor Devices, Springer Science & Business Media, 2010. This type of design is often desirable as it maximizes the trade-off between high breakdown and low on-resistance when the optimum doping and thickness for a desired breakdown is employed. See J. A. Cooper and D. T. Morisette, *IEEE Electron Device Lett.* 41(6), 892 (2020). If, however, the doping level is significantly less than the calculated optimum level based on the critical electric field, then the drift region resistivity will increase proportional to the inverse of the doping level. For the exemplary devices, the doping level is likely too low for the drift thickness, thereby resulting in an extreme punch-through condition and subsequently an increased specific on-resistance as compared to an ideal case.

Figure 8:
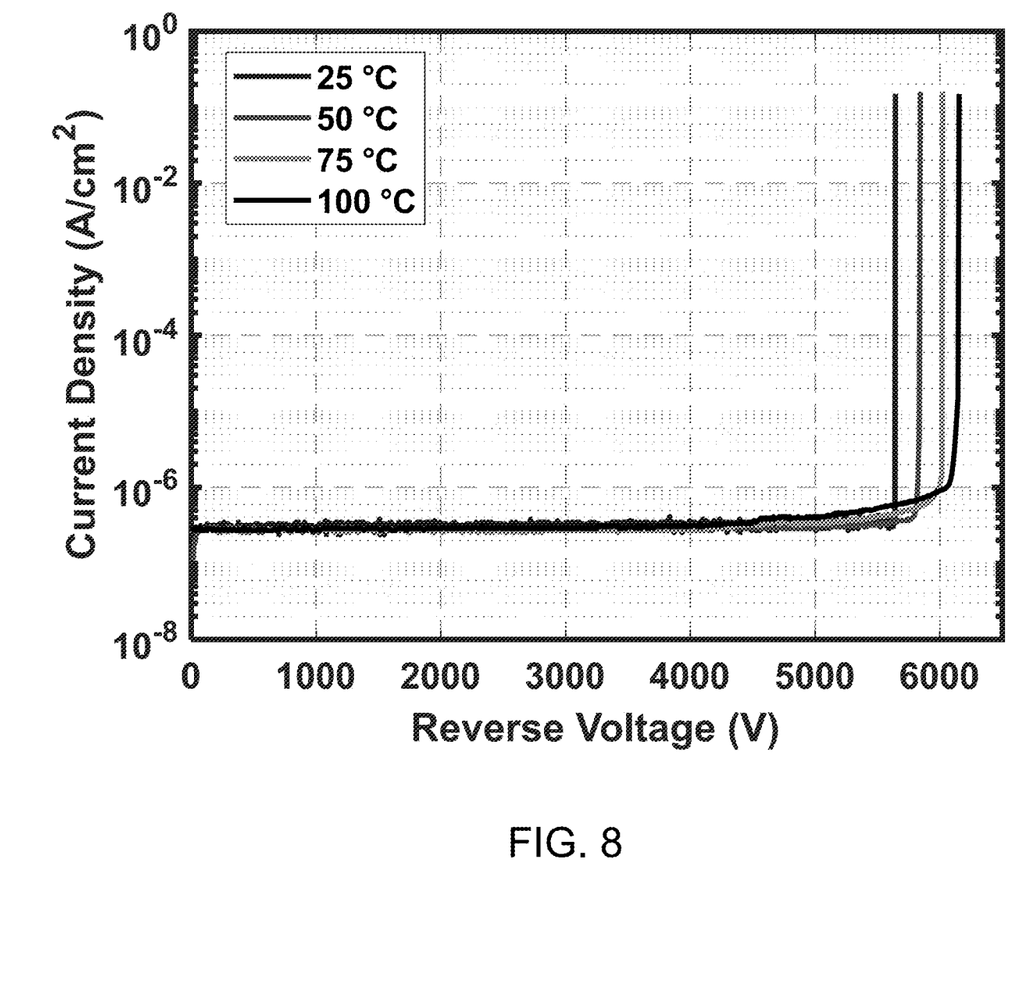
FIG. 8 is a graph showing the temperature dependence of the reverse I-V characteristics of a PN junction diode with an anode area of 0.063 mm$^2$.

As described above, knowledge of the impact ionization coefficients in GaN is essential to properly design and evaluate vertical GaN PN diodes. To evaluate the effectiveness of the exemplary JTE design, the ionization coefficients from Ji and Maeda were used to determine the expected breakdown voltage for the punch-through diodes at the measured carrier concentration. See D. Ji et al., *Appl. Phys. Lett.* 115(7), 073503 (2019); and T. Maeda et al., *J. Appl. Phys.* 129(18), 185702 (2021). For an $N_d-N_a$ of $6\times10^{14}$ cm$^{-3}$, a 50 μm drift region should be able to sustain a breakdown voltage of ~9.7 kV or ~7.3 kV according to Ji and Maeda, respectively. This would imply that the JTE is either 66% or 87% effective. Many of the devices experienced non-catastrophic breakdown; avalanche breakdown of a 5.6 kV device is shown in FIG. 8. A strong breakdown dependence on temperature was seen with an increased reverse leakage current prior to breakdown. This is in line with previous reports of avalanche breakdown in vertical GaN PN diodes; however, an increased temperature coefficient was observed compared to previous reports. According to a linear breakdown voltage dependence of $BV(T)=BV_{25°C}\cdot(1+\alpha\Delta T)$ with a measured $\alpha=12\times10^{-4}$ K$^{-1}$, approximately twice the dependence that has been previously reported by most authors, and more than 3× of that reported by Ji. See I. C. Kizilyalli et al., *IEEE Trans. Electron Devices* 60(10), 3067 (2013); O. Aktas and I. Kizilyalli, *IEEE Electron Device Lett.* 36(9), 890 (2015); H. Fukushima et al., *Jpn. J. Appl. Phys.* 58(SC), SCCD25 (2019); and D. Ji et al., "Robust avalanche in GaN leading to record performance in avalanche photodiode," in 2020 *IEEE International Reliability Physics Symposium (IRPS)*, 2020: IEEE, pp. 1-4.

The present invention has been described as a high voltage gallium nitride vertical PN diode. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A high voltage gallium nitride vertical PN diode, comprising:
   a high-doped n-type gallium nitride substrate or contact layer;
   a low-doped n-type gallium nitride drift layer epitaxially grown on the gallium nitride substrate, wherein the drift layer is greater than 10 microns in thickness and has a donor concentration of less than $2\times10^{15}$/cm$^3$;
   a p-type region comprising one or more p-type layers epitaxially grown on the drift layer, thereby forming a PN junction with the drift layer;
   an ohmic cathode contact deposited on the high-doped n-type gallium nitride substrate or contact layer;
   an ohmic anode contact deposited on the p-type region; and
   a step-etched multi-zone junction termination extension structure laterally surrounding the anode contact in the p-type region.

2. The high voltage gallium nitride vertical PN diode of claim 1, wherein the low-doped n-type gallium nitride drift layer is grown by metal-organic chemical vapor deposition under compensation doping conditions.

3. The high voltage gallium nitride vertical PN diode of claim 1, wherein the drift layer is equal to or greater than 50 microns in thickness.

4. The high voltage gallium nitride vertical PN diode of claim 1, wherein the area of the anode contact is greater than 0.01 mm$^2$.

5. The high voltage gallium nitride vertical PN diode of claim 4, wherein the area of the anode contact is greater than 0.1 mm$^2$.

6. The high voltage gallium nitride vertical PN diode of claim 1, wherein the p-type region comprises a moderately doped p-type gallium nitride layer epitaxially grown on the drift layer and a high-doped p-type gallium nitride layer epitaxially grown on the moderately doped p-type gallium nitride layer.

7. The high voltage gallium nitride vertical PN diode of claim 6, wherein the moderately doped p-type gallium nitride layer has an acceptor concentration of less than $10^{19}$ cm$^{-3}$.

8. The high voltage gallium nitride vertical PN diode of claim 6, wherein the high-doped p-type gallium nitride layer has an acceptor concentration of greater than $10^{19}$ cm$^{-3}$.

9. The high voltage gallium nitride vertical PN diode of claim 1, wherein the step-etched multi-zone junction termination extension structure comprises two or more zones.

10. The high voltage gallium nitride vertical PN diode of claim 1, wherein the PN diode has an avalanche breakdown voltage of greater than 5 kV in reverse bias.

* * * * *